United States Patent
Weaver et al.

(10) Patent No.: US 10,186,449 B2
(45) Date of Patent: Jan. 22, 2019

(54) APPARATUS AND METHODS FOR WAFER ROTATION TO IMPROVE SPATIAL ALD PROCESS UNIFORMITY

(71) Applicant: Applied Materials, Inc., Santa Clara, CA (US)

(72) Inventors: William T. Weaver, Austin, TX (US); Joseph Yudovsky, Campbell, CA (US); Jeffrey Blahnik, Volente, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/851,096

(22) Filed: Dec. 21, 2017

(65) Prior Publication Data
US 2018/0190535 A1 Jul. 5, 2018

Related U.S. Application Data

(60) Provisional application No. 62/441,324, filed on Dec. 31, 2016.

(51) Int. Cl.
*H01L 21/687* (2006.01)
*H01L 21/677* (2006.01)
(Continued)

(52) U.S. Cl.
CPC ........ *H01L 21/68764* (2013.01); *B25J 9/042* (2013.01); *B25J 9/043* (2013.01); *G06F 9/30032* (2013.01); *H01L 21/67196* (2013.01); *H01L 21/67739* (2013.01); *H01L 21/67742* (2013.01); *H01L 21/67748* (2013.01); *H01L 21/67763* (2013.01); *H01L 21/68707* (2013.01)

(58) Field of Classification Search
CPC .................................. B25J 9/042; B25J 9/043
See application file for complete search history.

(56) References Cited

U.S. PATENT DOCUMENTS 4,775,281 A * 10/1988 Prentakis ............... B23Q 7/048
118/500
5,046,909 A * 9/1991 Murdoch .......... H01L 21/68707
294/113
(Continued)

FOREIGN PATENT DOCUMENTS

WO    2014143662 A1    9/2014

OTHER PUBLICATIONS

PCT International Search Report and Written Opinion in PCT/US2017/067923 dated Apr. 23, 2018, 13 pages.

*Primary Examiner* — Gerald McClain
(74) *Attorney, Agent, or Firm* — Servilla Whitney LLC

(57) ABSTRACT

Apparatus and methods for rotating wafers during processing include a wafer rotation assembly with a support fixture connected to a shaft and a wafer transfer assembly with a robot blade with an opening therethrough, the opening sized to allow the support surface of the support fixture to pass through the opening. A first actuator is connected to the wafer rotation assembly to rotate the support fixture assembly about an axis of the shaft. A second actuator is connected to the wafer rotation assembly to move the support fixture assembly a stroke distance along the axis of the shaft. Process kits including the wafer rotation assemblies and robot blades with openings can used to retrofit existing mainframe processing chambers.

14 Claims, 12 Drawing Sheets

(51) Int. Cl.
    *G06F 9/30*     (2018.01)
    *B25J 9/04*     (2006.01)
    *H01L 21/67*     (2006.01)

(56) References Cited

U.S. PATENT DOCUMENTS

| | | | |
|---|---|---|---|
| 5,498,294 A * | 3/1996 | Matsushita | H01L 21/67028 134/18 |
| 5,905,850 A | 5/1999 | Kaveh | |
| 6,164,894 A * | 12/2000 | Cheng | G01R 31/2831 414/222.01 |
| 7,033,126 B2 * | 4/2006 | Van Den Berg | H01L 21/67781 414/416.03 |
| 2002/0192056 A1 | 12/2002 | Reimer et al. | |
| 2003/0053904 A1 * | 3/2003 | Kirihata | H01L 21/68 414/783 |
| 2007/0004058 A1 * | 1/2007 | Lee | H01L 21/681 438/14 |
| 2008/0056854 A1 | 3/2008 | Yamagishi et al. | |
| 2008/0067438 A1 | 3/2008 | Halling | |

\* cited by examiner

APPARATUS AND METHODS FOR WAFER ROTATION TO IMPROVE SPATIAL ALD PROCESS UNIFORMITY

CROSS-REFERENCE TO RELATED APPLICATIONS

This application claims priority to U.S. Provisional Application No. 62/441,324, filed Dec. 31, 2016, the entire disclosure of which is hereby incorporated by reference herein.

TECHNICAL FIELD

The present disclosure generally relates to methods and apparatus to improve process uniformity. In particular, the disclosure relates to methods and apparatus to rotate wafers to improve spatial atomic layer deposition process uniformity.

BACKGROUND

Process uniformity in mainframe processing chambers can be poor due to a variety of factors. Rotating wafers throughout the process can help improve the within wafer uniformity. The amount of rotation small and/or a few rotations can improve the uniformity. Rotating a wafer during processing can be time consuming and uses additional process hardware or space. For example, the wafers can be moved to a dedicated region of a processing tool where the wafer can be rotated. This is inefficient from a throughput perspective and uses additional floor space for a batch processing tool or cluster tool.

Therefore, there is a need in the art for methods and apparatus to rotate wafers during processing in mainframe process chambers to increase within wafer uniformity.

SUMMARY

One or more embodiments of the disclosure are directed to apparatus comprising a housing, a wafer transport assembly and a wafer rotation assembly. The housing has a bottom and sidewall. The sidewall includes at least one opening extending through the sidewall. The bottom includes a robot adapter plate to connect a wafer transport assembly. The wafer transport assembly includes a robot hub, a main robot linkage coupled to the robot hub and a robot blade coupled to the main robot linkage. The robot blade has a length with a distal end and an opening through the robot blade. The wafer rotation assembly comprises a support fixture assembly comprising a support fixture connected to a shaft. The support fixture has a support surface and is sized to pass through the opening in the robot blade. A first actuator rotates the support fixture assembly about an axis of the shaft. A second actuator moves the support fixture assembly along the axis of the shaft.

Additional embodiments of the disclosure are directed to process kits comprising a wafer rotation assembly, a robot adapter plate and at least one robot blade. The wafer rotation assembly comprises a support fixture assembly including a support fixture connected to a shaft. The support fixture has a support surface, a first actuator to rotate the support fixture assembly about an axis of the shaft, and a second actuator to move the support fixture assembly along a stroke distance the axis of the shaft. The robot adapter plate is configured to be connected to a transfer station of a cluster tool. The robot adapter plate has at least one wafer rotation opening to allow the shaft and support fixture of the support fixture assembly to pass therethrough. The robot blade is configured to be connected to a robot blade hub of a wafer transfer assembly at a proximal end of the robot blade. The robot blade has a distal end and an opening adjacent the distal end. The opening is sized to allow the support surface of the support fixture of the wafer rotation assembly to pass therethrough.

Further embodiments of the disclosure are directed to methods comprising moving a robot blade through a slit valve in a sidewall of a transfer station and into a processing chamber connected to the transfer station. The robot blade is moved through the slit valve in the sidewall from the processing chamber into the transfer station, the robot blade supporting a wafer removed from the processing chamber. A support fixture of a wafer rotation assembly is moved through an opening in the robot blade to move the wafer a distance from the robot blade. The support fixture and the wafer on the support fixture is rotated by a predetermined amount. The support fixture of the wafer rotation assembly is moved through the opening in the robot blade to move the wafer back onto the robot blade so that an orientation of the wafer on the robot blade has changed.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Figure 1:
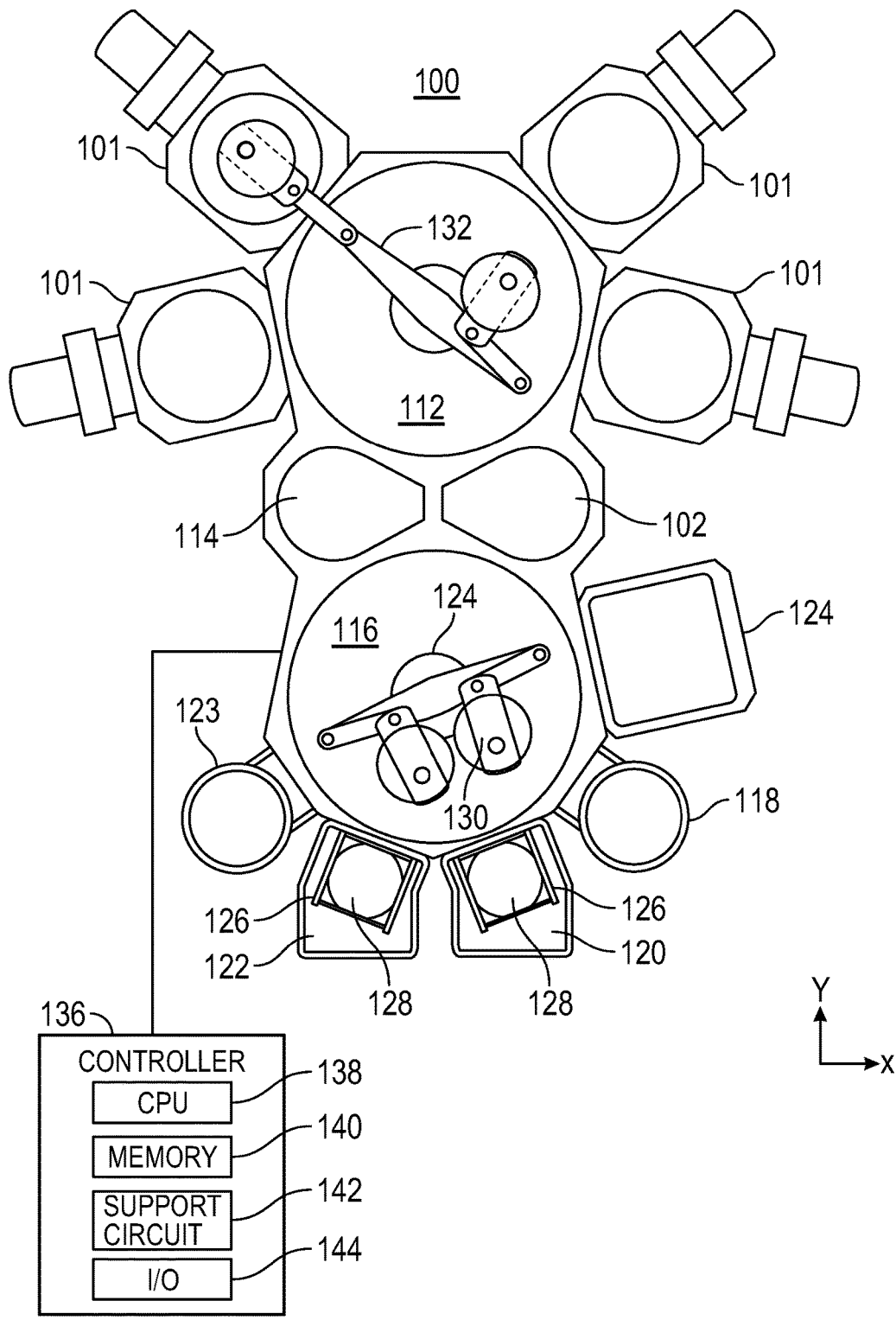
FIG. 1 illustrates a top view of a cluster tool in accordance with one or more embodiment of the disclosure.

FIG. 1 depicts a schematic diagram of one embodiment of cluster tool 100 that can be configured with either single, dual, or multiple blade robots to transfer substrates between chambers or process chambers. While the configuration and the operation of a typical embodiment of cluster tool are described, the skilled artisan will recognize that other configurations and operations can be utilized with embodiments of the disclosure.

The cluster tool 100 shown in FIG. 1 includes four process chambers 101, a transfer chamber 112, a preclean chamber 114, a buffer chamber 116, a substrate orienter/degas chamber 118, a cooldown chamber 102, a metrology chamber 123 and a pair of load lock chambers 120 and 122. Each process chamber 101 can be configured to provide a different stage or phase of semiconductor substrate processing. The buffer chamber 116 is centrally located and in fluid communication between the transfer chamber 112, the plurality of load lock chambers 120 and 122, the metrology chamber 123, the substrate orienter/degas chamber 118, the preclean chamber 114, and the cooldown chamber 102. The transfer chamber 112 is in fluid communication with a plurality of process chambers 101, the preclean chamber 114, and the cooldown chamber 102.

The buffer chamber 116 contains a first robot transfer assembly 124 to effectuate substrate transfer amongst the chambers surrounding the buffer chamber 116. The substrates (wafers 128) prior to, and following being transferred by the first robot transfer assembly 124 are typically contained in a cassette 126. One cassette 126 is mounted within each one of the load lock chambers 120 or 122. The first wafer transport assembly 124 transports the substrates (wafers 128), one at a time, from the cassette 126 directly to any of the chambers 118, 102, 120, 122, 123, or 114. As an exemplary robot motion, during processing in a cluster tool, a substrate is first placed in the substrate orienter/degas chamber 118 then moved to the preclean chamber 114. The cooldown chamber 102 is generally not used until after the substrate is processed within the process chambers 101. The substrate (wafer 128) may be inserted in the metrology chamber 123 prior to, or following, processing in process chamber 101 to measure or inspect the electric or physical characteristics of a substrate. Individual substrates (wafers 128) are carried upon a substrate transport blade 130 that is located at the distal end of the first wafer transport assembly 124.

A wafer transport assembly 132 transports one, or a pair of, substrates(s) between different ones of the process chambers 101. The embodiment of wafer transport assembly 132 in FIG. 1 is similar to the first robot transfer assembly 124; however, those skilled in the art will understand that different robot transport assemblies can be used. The wafer transport assembly 132 can drop off or pick up substrates relative to the transfer chamber 112 and/or the preclean chamber 114. Alternatively, the wafer transport assembly 132 can drop off or pick up substrates relative to chambers 102 and/or 114.

A controller 136 controls the transport operation of both the wafer transport assemblies 124, 132 and/or the operation of the cluster tool 100. The controller 136 can be a single controller or more than one controller. The controller 136 controls the processing, inspecting, substrate transfer, and other processes performed by the cluster tool 100. The controller 136 contains a processor 138 (CPU), a memory 140 for storing the control routines, and support circuits 142, such as power supplies, clock circuits, cache, and the like. The controller 136 may also include input/output peripherals 144 such as a keyboard, mouse, and display. In one embodiment, the controller 136 is a general-purpose computer that is programmed to perform the sequencing and scheduling of the substrate processing operations and the robot transfer of substrates. It is contemplated that some of the process steps described herein as software processes may also be implemented with hardware (e.g., as circuitry) that cooperates to perform various process steps. The processes performed by the controller 136 can also be implemented as application specific integrated circuit (ASIC) or discrete circuit components.

The structure and operation of process chambers 101 may be configured for a process to be performed within one or more process chamber. For example, the process chambers may perform physical vapor deposition (PVD), chemical vapor deposition (CVD), atomic layer deposition (ALD), etching, or cleaning electroplating, or other deposition processes.

Figure 2:
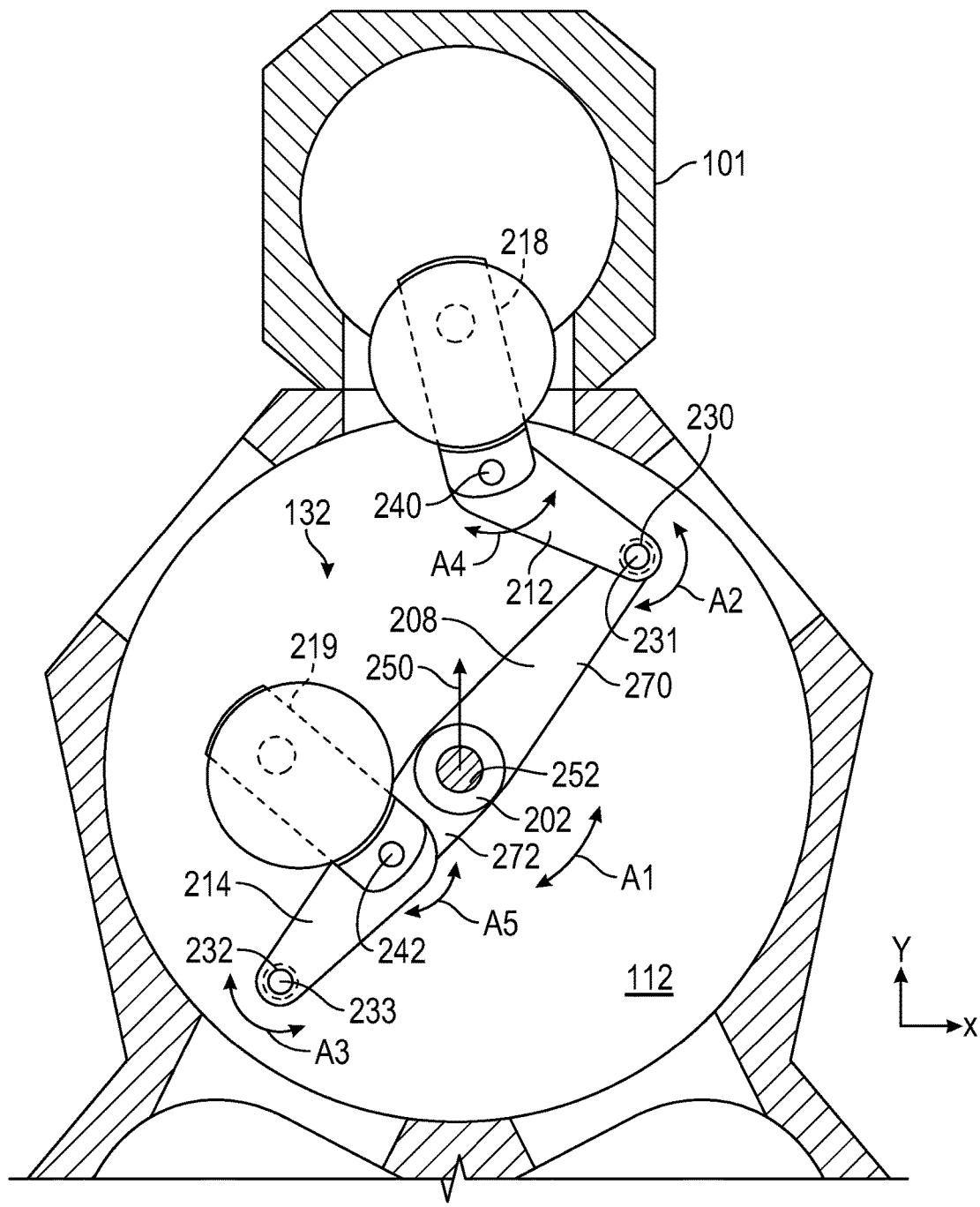
FIG. 2 illustrates a partial top view of a transfer chamber and robot of the cluster tool of FIG. 1.

FIG. 2 shows a top view of one embodiment of the wafer transport assembly 132 as shown in FIG. 1. The wafer transport assembly 132 positioned in the transfer chamber 112 may (or may not) be structurally and functionally identical to the first wafer transport assembly 124 contained in the buffer chamber 116. The wafer transport assembly 132 shown in FIG. 2 comprises a robot hub 202, an axle 252, a main robot linkage 208 having a first end 270 and a second end 272 distally positioned about the robot hub 202, a first extension hub 230, a first extension axle 231, a second extension hub 232, a second extension axle 233, a first extension arm 212, a second extension arm 214, a first robot blade 218, a second robot blade 219, a first robot blade hub 240 and a second robot blade hub 242. The wafer transport assembly 132 can also include one or more pulleys, belts, actuators and/or wiring to enable movement of the robot components.

The term "robot blade" is intended to describe any end effector, robot blade, or similar structure that is configured to hold a substrate or a plurality of substrates. Each robot blades 218, 219 may be configured in a side-to-side configuration, or as one above the other configuration, to provide for the sequential insertion of a plurality of substrates into one, or more, process chambers, or to provide for the simultaneous insertion of a plurality of substrates into a plurality of process chambers.

The axle 252 is attached (e.g., by fastener, rivet, adhesive, welds, key, or the like) to robot hub 202 in a manner such that a actuator (not shown) provides controllable rotation, within a substantially horizontal plane, of the main robot linkage 208 about axis 250 (which extends out of the x-y plane of the page) of robot hub 202 as indicated by arrow A1.

The hub motor M1 (as well as the extension motors M2 and M3) is preferably a stepper or electromechanical motor, but is any device that can be actuated through prescribed incremental angles may be used. The incremental angles at which the hub motor M1 rotate the main robot linkage 208 depend on the arrangement, and angle of the cells in the cluster tool about the wafer transport assembly 132.

As the hub motor (not shown) rotates the main robot linkage 208 so the latter is aligned with a chamber 101, one of the extension arms 212, 214, and its associated robot blade 218, 219 are simultaneously displaced at a prescribed angle relative to one of the process chambers 101. For example, the hub motor can be configured to incrementally rotate the main robot linkage 208 (and the respective extension arms 212, 214 plus the respective robot blades 218, 219) of the wafer transport assembly 132 to a first aligned position as shown in FIG. 2 relative to a single process chamber 101. In the first aligned position, the first extension arm 212 and the first robot blade 218 are extended to insert the first robot blade 218 in process chamber 101. In the second aligned position (not illustrated), the second extension arm 214 and the second robot blade 219 are extended so the second robot blade 219 is inserted in a process chamber. The robot hub 202 may be of the type to which polar robots are typically fixedly mounted, though any type of suitable robot hub that can rotatably index the main robot linkage 208 is within the scope of the disclosure.

The first extension arm 212 and the second extension arm 214 are attached to the main robot linkage 208 at opposite lateral or distal ends. In the illustrated embodiment, the first extension axle 231 is non-rotatably affixed to the main robot linkage 208 by bolt, key, adhesive, weld or other such fastener. The first extension hub 230 is fixedly mounted to the first extension arm 212 at the first end 270 of the main robot linkage 208. Rotation of the first extension hub 230 results in rotation of the first extension arm relative to the main robot linkage 208 within a substantially horizontal plane. A first hub pulley (not shown) can be mounted about the axle 252 by bearings so that the first extension motor rotatably drives the first hub pulley by a fraction drive or other known system. The belt on the first hub pulley can extend between, and transfers rotational motive force between, the first hub pulley and a first extension pulley (not shown). The first extension pulley can be fixedly mounted relative to the first extension hub 230 to transfer rotation therebetween.

The second extension hub 232 is coaxial with the second extension axle 233 and fixedly mounted to the second extension arm 214 at the second end 272 of the main robot linkage 208. Rotation of the second extension hub 232 thus results in rotation of the second extension arm 214 within a substantially horizontal plane relative to the main robot linkage 208. A second hub pulley (not shown) can be concentrically rotatably mounted about the axle 252 by bearings so that a motor (not shown) rotatably drives the second hub pulley. A belt on the second hub pulley can extend between, and transmit rotational motive force between, the second hub pulley and the second extension pulley (not shown). The second extension pulley is fixedly mounted relative to the second extension hub to transfer rotation therebetween.

The configuration described with respect to FIG. 2 permits the first extension arm 212 to rotate, as indicated by arrow A2 about the first end 270 of the main robot linkage 208 between a variety of different angular positions. Similarly, the second extension arm 214 can rotate, as indicated by arrow A3 about the second end 272 of the main robot linkage 208 between a variety of different angular positions. The second end 272 of the main robot linkage is located on an opposite lateral side of the robot hub 202 from the first end 270.

The first robot blade 218 can be fixedly mounted to the first robot blade hub 240. The first robot blade hub 240 is mounted to be able to rotate in the horizontal plane as indicated by arrow A4 at the distal end of the first extension arm 212 from the first extension hub 230. The second robot blade 219 is fixedly mounted to the second robot blade hub 242. The second robot blade hub 242 is mounted to be able to rotate in the horizontal plane as indicated by arrow A5 at the distal end of the second extension arm 214 from the second extension hub 232.

One or more embodiments of the disclosure are directed to retrofittable external wafer rotation assemblies which can be retrofit to an existing mainframe with minimal changes. The external wafer rotation assembly can rotated a wafer by ±180° or in complete circles or increments of circles. The assembly can handle wafers at elevated temperatures (e.g., up to about 600° C.).

More than one rotation assembly can be added to a single process chamber or transfer station. In some embodiments, the transfer station has two rotation assemblies.

The wafer handling robot can be modified or replaced to allow the rotation assembly to operate without interfering with wafer movements. In some embodiments, the robot blade is modified to include an opening that will allow a wafer rotation assembly support fixture to pass through the opening. This allows the rotation assembly to lift the wafer from the robot blade, rotate the wafer and lower the wafer back to the robot blade.

The support fixture assembly on the wafer rotation assembly can be a single support post that has one contact point over a fixed area of the wafer, or can have multiple support posts. The posts can be made from any suitable material that can support and rotate the wafer without causing damage or slippage of the wafer on the support fixture support post. For example, the support posts can be alumina or some other dielectric material. The speed of rotation of the support fixture assembly can be changed depending on the friction of the wafer contact surface. A support post having a contact surface with a lower coefficient of friction can be rotated at a slower rate than a support post with a higher coefficient of friction. In some embodiments, the support post is a conductive material that can provide a ground path to minimize charge buildup on the wafer.

The rotation assembly can move the support fixture support post a vertical distance; also called the stroke. The stroke of support post can be in the range of about 0.5 inch to about 12 inches. In some embodiments, the stroke is up to about 8 inches, 7 inches or 6 inches. The rotation assembly of some embodiments is mounted to the underside of the robot adapter plate in the central transfer station of a mainframe or cluster tool. The robot adapter plate can be unmodified or replaced with a different adapter plate.

In use, a robot blade located in the transfer station can reach into the batch process chamber and withdraw a wafer. In the transfer station, the rotation assembly can be elevated to cause the support fixture of the rotation assembly to pass through a hole in the robot blade to lift the wafer from robot blade. The rotation assembly can rotate the wafer a fixed amount (e.g., 180°) and lower the wafer back to the robot blade. The robot blade can then extend back into the batch process chamber and replace the wafer for further processing.

Figure 3:
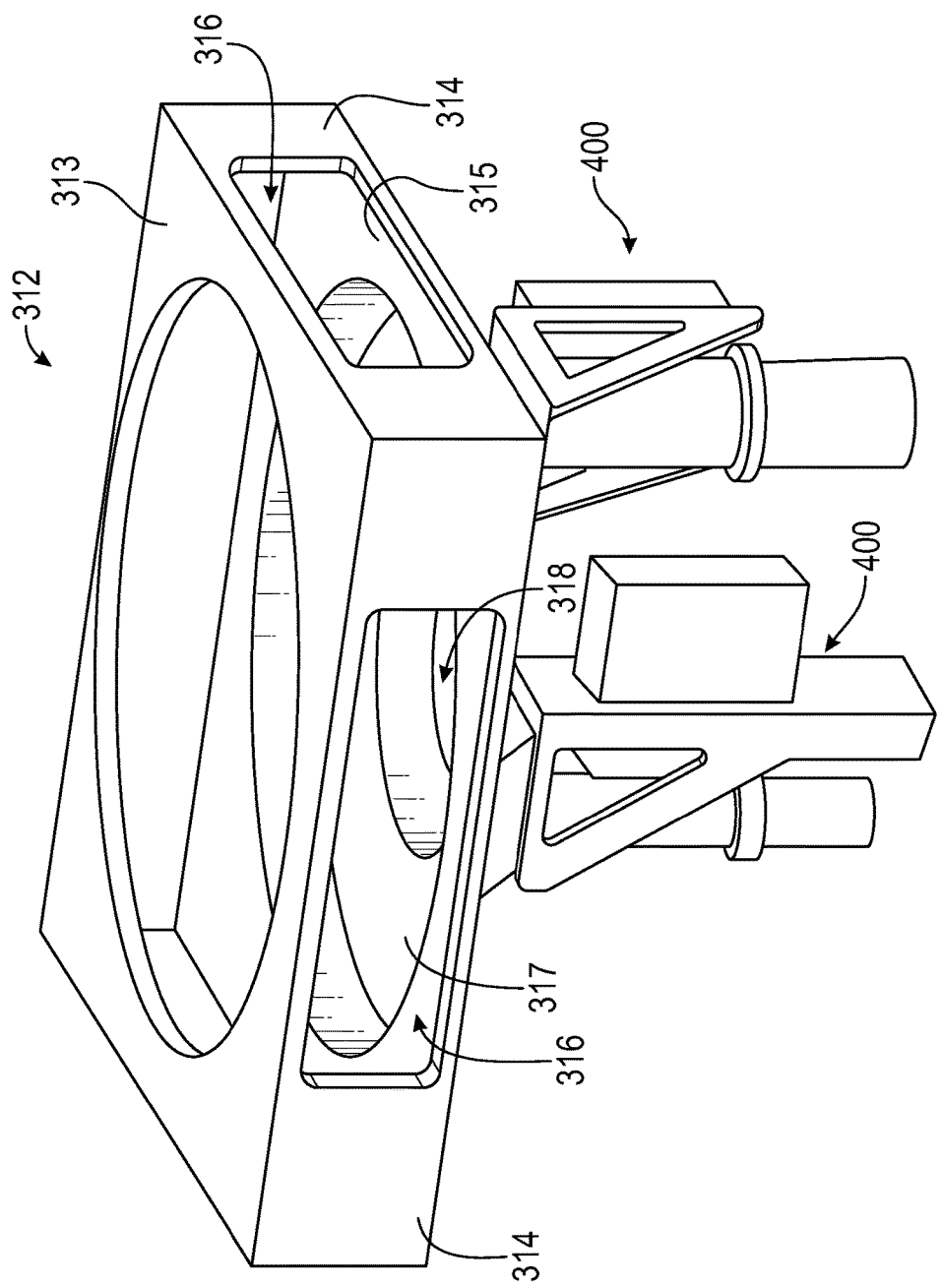
FIG. 3 illustrates an isometric view of a transfer chamber with wafer rotation assemblies in accordance with one or more embodiment of the disclosure.

Referring to FIG. 3, one or more embodiments of the disclosure are directed to transfer chambers 312 for a mainframe processing tool (also referred to as a cluster tool) as illustrated in FIG. 1. The transfer chamber 312 illustrated includes a housing 313 with a bottom 315 and a sidewall 314. The housing 313 illustrated in FIG. 3 has four sides which are arranged in a square shaped configuration. This is merely illustrative of one possible configuration and should not be taken as limiting the scope of the disclosure. In some embodiments, there are less than or more than four sides. The sidewalls 314 provide an outer boundary to the transfer chamber 312 and can include components to connect one or more processing chambers thereto.

The housing 313 shown has an open top which can be closed with a top plate (not shown) or can be a solid component connected to the sidewalls 314. A top plate may provide easy access to the interior of the housing 313 for maintenance purposes.

The sidewall 314 of the housing 313 includes at least one opening 316 that extends through the sidewall 314. The at least one opening 316 can be configured as a slit valve or similar component that can be opened and closed to separate the interior of the housing 313 from an adjacent component. For example, a processing chamber 101 can be connected to the sidewall 314 (as shown in FIG. 2) and configured so that a wafer can be passed between the interior of the housing 313 and the processing chamber 101 when the slit valve is open.

The bottom 315 of the housing 313 can be a single component or multiple components. In some embodiments, the bottom 315 of the housing 313 includes a robot adapter plate 317 which can be connected to the bottom 315 to seal the interior of the housing 313. The robot adapter plate 317 can be substantially permanently attached to the bottom 315 (i.e., by welded together) or can be removably attached to the bottom 315 (i.e., by bolting together).

Figure 4:
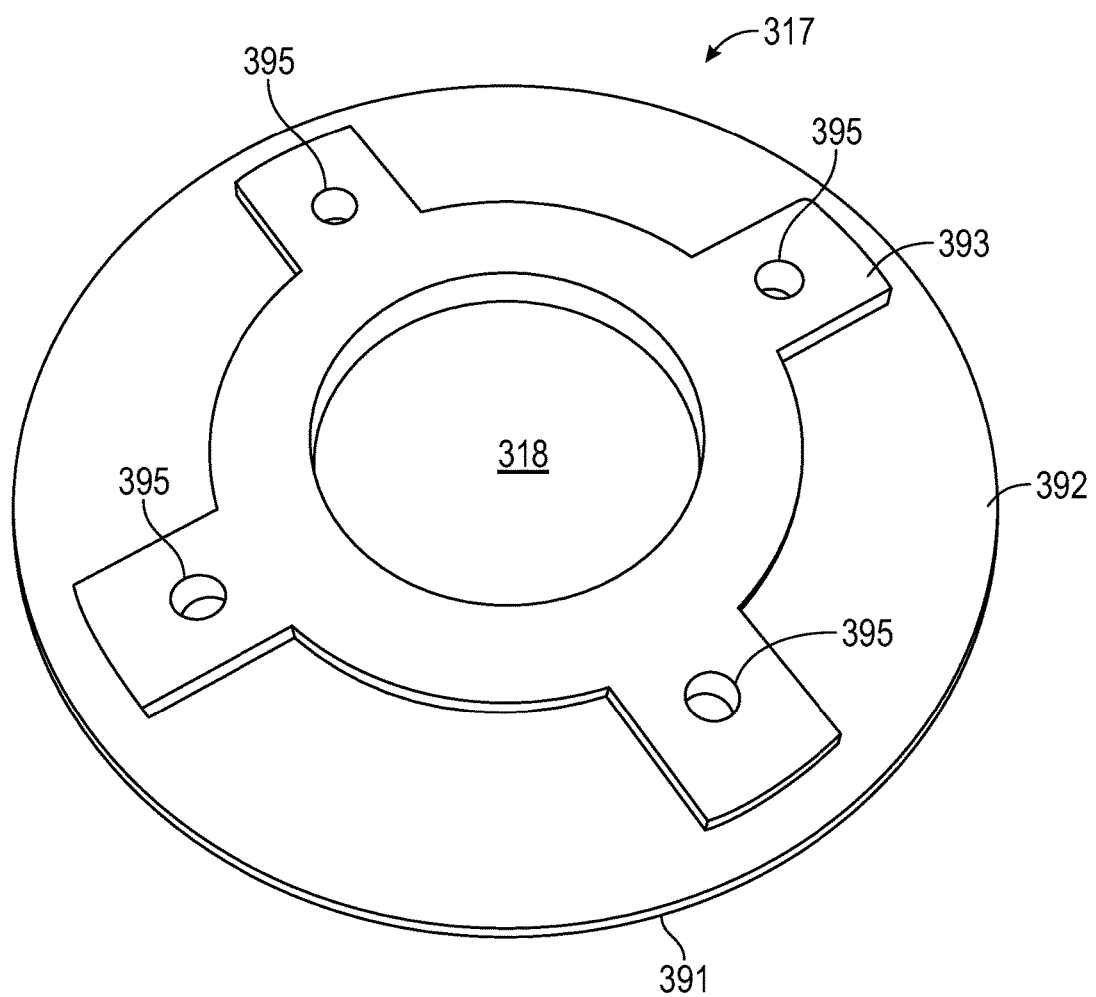
FIG. 4 is a bottom perspective view of a robot adapter plate for use with a transfer chamber in accordance with one or more embodiment of the disclosure.

FIG. 4 shows an embodiment of a robot adapter plate 317 in accordance with one or more embodiment of the disclosure. The robot adapter plate 317 is exemplary of one possible configuration and should not be taken as limiting the scope of the disclosure. The robot adapter plate 317 has a top surface 391 and a bottom surface 392. The bottom surface 392 in the illustrated embodiment includes a connection plate 393 that extends from the bottom surface 392 by a distance. The connection plate 393 can be a separate component attached to the bottom surface 392 of the robot adapter plate 317 or can be integrally formed with the robot adapter plate 317. The connection plate 393 may have connectors (e.g., bolts, nuts, clamps) to allow for other components to be attached to the robot adapter plate 317. The shape and size of the connection plate 393 can vary depending on, for example, the shape of the housing 313 and the number of openings 316 in the sidewall 314 of the housing 313. The distance that the connection plate 393 extends from the bottom surface 392 can be in the range of about 0.05 inch to about 5 inches (about 1.25 mm to about 125 mm), or in the range of about 0.1 inch to about 4 inches (about 2.5 mm to about 100 mm), or in the range of about 0.25 inch to about 3 inches (about 6 mm to about 75 mm), or in the range of about 0.375 inch to about 2 inches (about 9.5 mm to about 50 mm), or in the range of about 0.5 inch to about 1.5 inches (about 13 mm to about 30 mm).

The robot adapter plate 317 has at least one wafer rotation opening 395. In some embodiments, the wafer rotation openings 395 are positioned on the connection plate 393. The embodiment illustrated has four wafer rotation openings 395 with each opening in a portion of the connection plate 393. The wafer rotation openings 395 allow a wafer rotation assembly to be positioned on a side of the bottom 315 opposite a wafer transport assembly 132 and allow a shaft and support fixture of the wafer rotation assembly to move through the wafer rotation opening 395. The wafer rotation openings 395 can be sealed if not needed. In some embodiments, the bottom 315 or robot adapter plate 317 (and/or connection plate 393) is configured to have a wafer rotation opening 395 adjacent each opening 316 in the sidewall 314 of the housing 313.

In some embodiments, the bottom 315 of the housing 313 has at least one wafer rotation opening 395 to allow the wafer rotation assembly 400 to be positioned on a side of the bottom 315 opposite the wafer transport assembly 132 and allow the shaft 412 and support fixture 414 of the wafer rotation assembly 400 to move through the opening. In some embodiments, the robot adapter plate 317 has an opening 318 through which a vacuum source or robot assembly can be positioned in the interior of the housing 313. In some embodiments, the bottom 315 of the housing 313 or the robot adapter plate 317 has two, three, four, five or six wafer rotation openings 395.

In some embodiments, the robot adapter plate 317 is included in a process kit to retrofit an existing transfer chamber. The robot adapter plate 317 can be used to replace the bottom of the existing transfer chamber so that a wafer rotation assembly can be added to an existing cluster tool.

Figure 5:
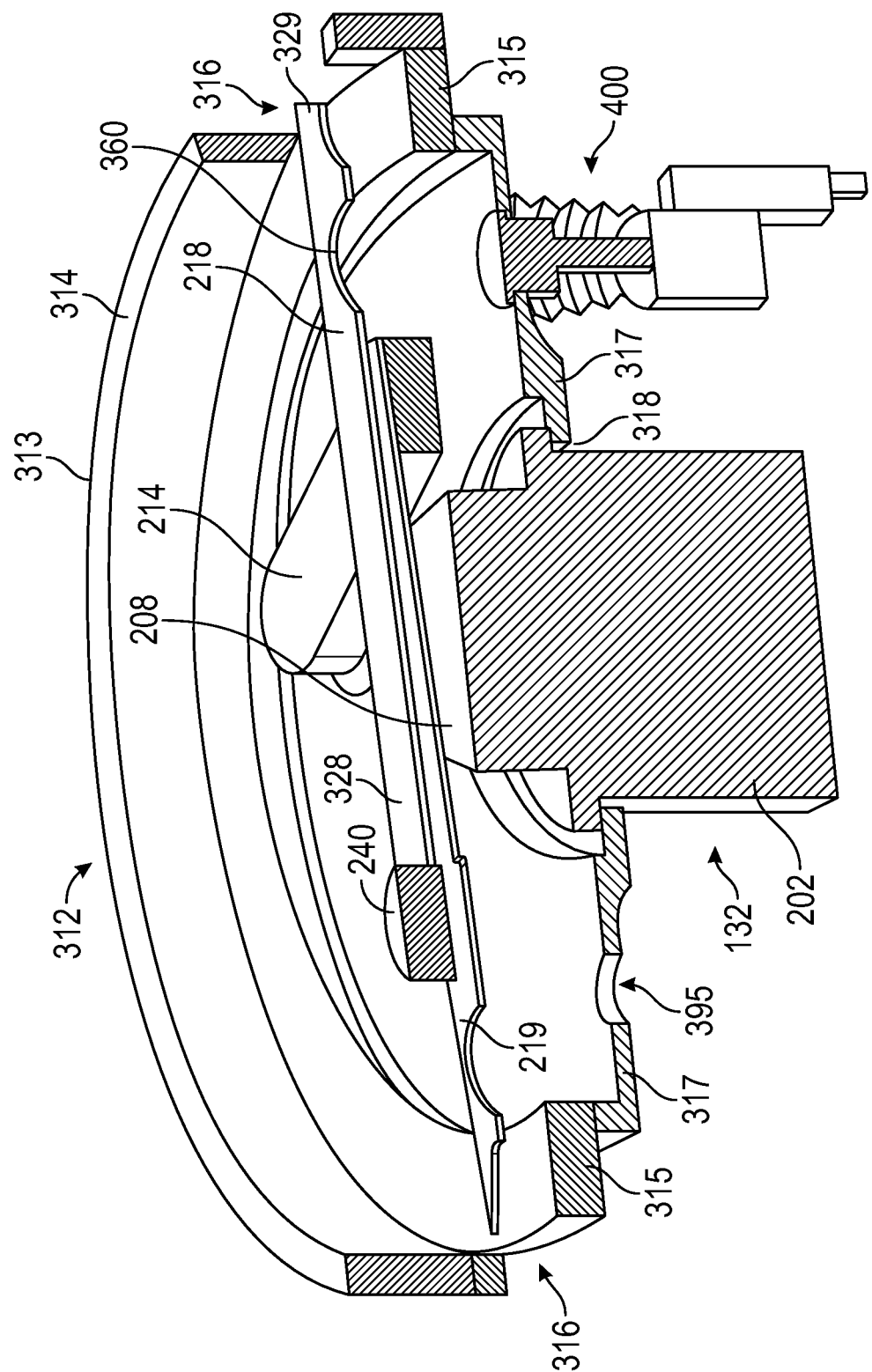
FIG. 5 shows a partial cross-sectional perspective view of a transfer chamber in accordance with one or more embodiment of the disclosure.

For illustration purposes, the transfer chamber 312 shown in FIG. 3 does not include a wafer transport assembly (also referred to as a robot assembly). The wafer transport assembly 132 can be positioned in the opening 318 in the robot adapter plate 317, or bottom 315 of the housing, as shown in FIG. 5. Referring to FIGS. 2 and 5, a wafer transport assembly 132 includes a robot hub 202 with a main robot linkage 208 coupled thereto. One or more robot blade 218, 219 is coupled to the main robot linkage 208. The robot blade 218 has a length with a proximal end 328 and a distal end 319. The robot blade 218 can be coupled to the main robot linkage 208 through any suitable coupling component known to the skilled artisan. In some embodiments, the robot blade 218 is coupled to the main robot linkage 208 through an extension arm 212. The robot blade 218 can be connected to the extension arm 212 at a robot blade hub 240 and the extension arm 212 can be connected to the main robot linkage 208 at extension hub 230. In some embodiments, the wafer transport assembly 132 further comprise a second robot blade 219 coupled to the main robot linkage 208. The second robot blade 219 has a proximal end and a distal end.

Figure 6A:
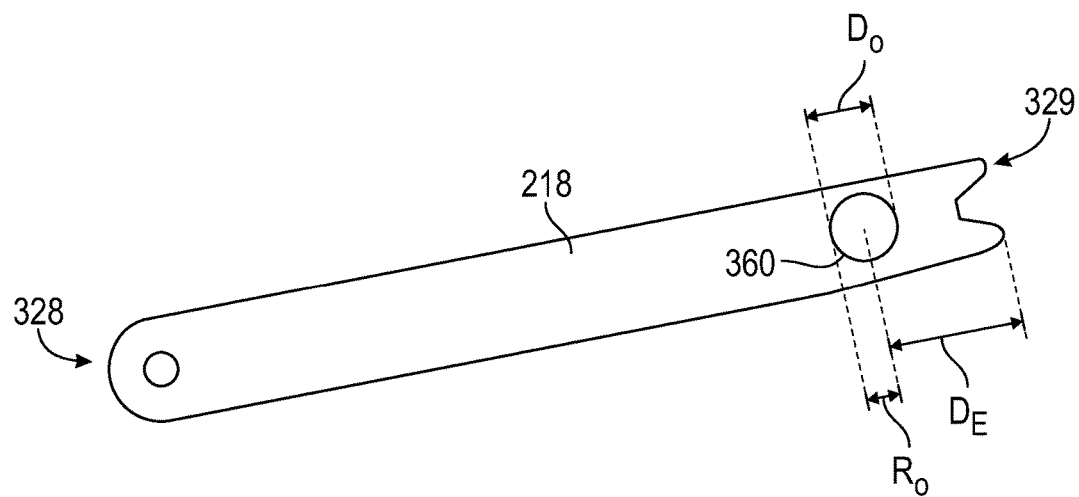
FIGS. 6A and 6B illustrate robot blades for use with a wafer rotation assembly in accordance with one or more embodiment of the disclosure.
Figure 6B:
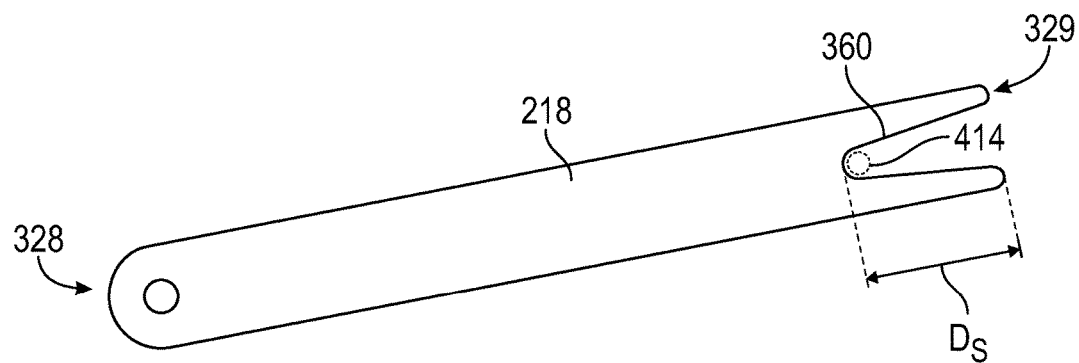

One or more robot blade 218 has an opening 360 extending through the body of the robot blade. The opening 360 is positioned adjacent to or near the distal end 329 and can be any suitable shape and size. As illustrated in FIG. 6A, the opening 360 in the robot blade 218 can be centered a distance $D_E$ from the distal end 329 of the robot blade 218. In some embodiments, the opening 360 in the robot blade 218 is centered a distance $D_E$ from the distal end 329 of the robot blade 218 by an amount equal to about the radius of a wafer to be transferred by the robot blade 218. For example, if a wafer to be transferred by the robot blade 218 is 300 mm in diameter, the center of the opening 360 could be located about 150 mm from the distal end 329 of the robot blade 218. In some embodiments, the center of the opening 360 is within about 80% to about 120%, or within about 85% to about 115%, or within about 90% to about 110% or within about 95% to about 105%, or within about 98% to about 102%, or within about 99% to about 101% of the radius of a wafer to be transferred. In embodiments in which a 300 mm wafer will be transferred, the center of the opening 360 is within about 120 mm to about 180 mm, or within about 135 mm to about 165 mm, or within about 140 mm to about 160 mm, or within about 145 mm to about 155 mm, or within about 148 mm to about 152 mm of the distal end 329 of the robot blade 218. The diameter $D_o$ and radius $R_o$ of the opening are also illustrated in the Figure. In some embodiments, as shown in FIG. 6B, the opening 360 extends to the distal end 329 of the robot blade 218 so that a slot is formed. The distance $D_s$ to the end of the slotted opening is sufficient to allow the support fixture 414 to extend through the opening and be centered on a wafer being supported by the robot blade 218. For example, if the wafer being supported is a 300 mm wafer and the edge of the wafer is even with the edge of the distal end 329 of the robot blade, the distance $D_s$ to the end of the slotted opening will be at least 150 mm (the center of the wafer) plus the radius (or half of the size) of the support fixture.

In some embodiments, the location of the opening 360 is based on the position on the robot blade 218 when supporting a wafer relative to the center of mass of the wafer. For example, if the wafer extends beyond the distal end 329 of the robot blade 218 during movement, the center of the opening 360 will be based on the center of mass of the wafer. If the center of mass of the wafer on the robot blade is located 130 mm (for example only) of the distal end 329 of the robot blade, then the center of the opening 360 can be within about 80% to about 120%, or within about 85% to about 115%, or within about 90% to about 110% or within about 95% to about 105%, or within about 98% to about 102%, or within about 99% to about 101% of 130 mm (the location of the center of mass).

One or more wafer rotation assembly 400 can be connected to the bottom 315 of the housing 313 or to the robot adapter plate 317. The embodiment illustrated in FIG. 3 shows two wafer rotation assemblies 400 connected to the housing 313 of the transfer chamber 312. However, those skilled in the art will understand that there can be more or less than two wafer rotation assemblies 400 connected to the transfer chamber 312.

Figure 7:
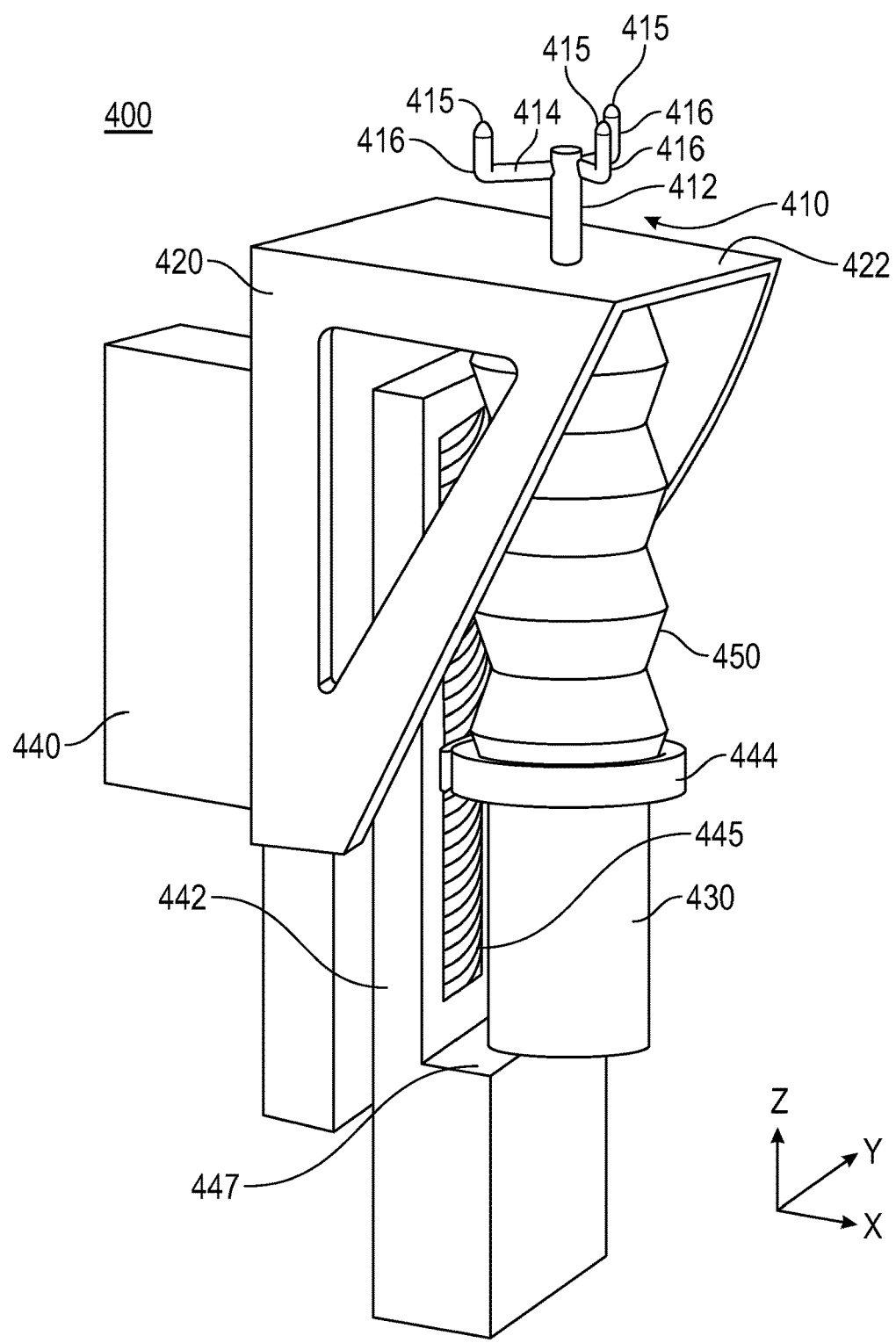
FIG. 7 illustrates an isometric view of a wafer rotation assembly in accordance with one or more embodiment of the disclosure.
Figure 8:
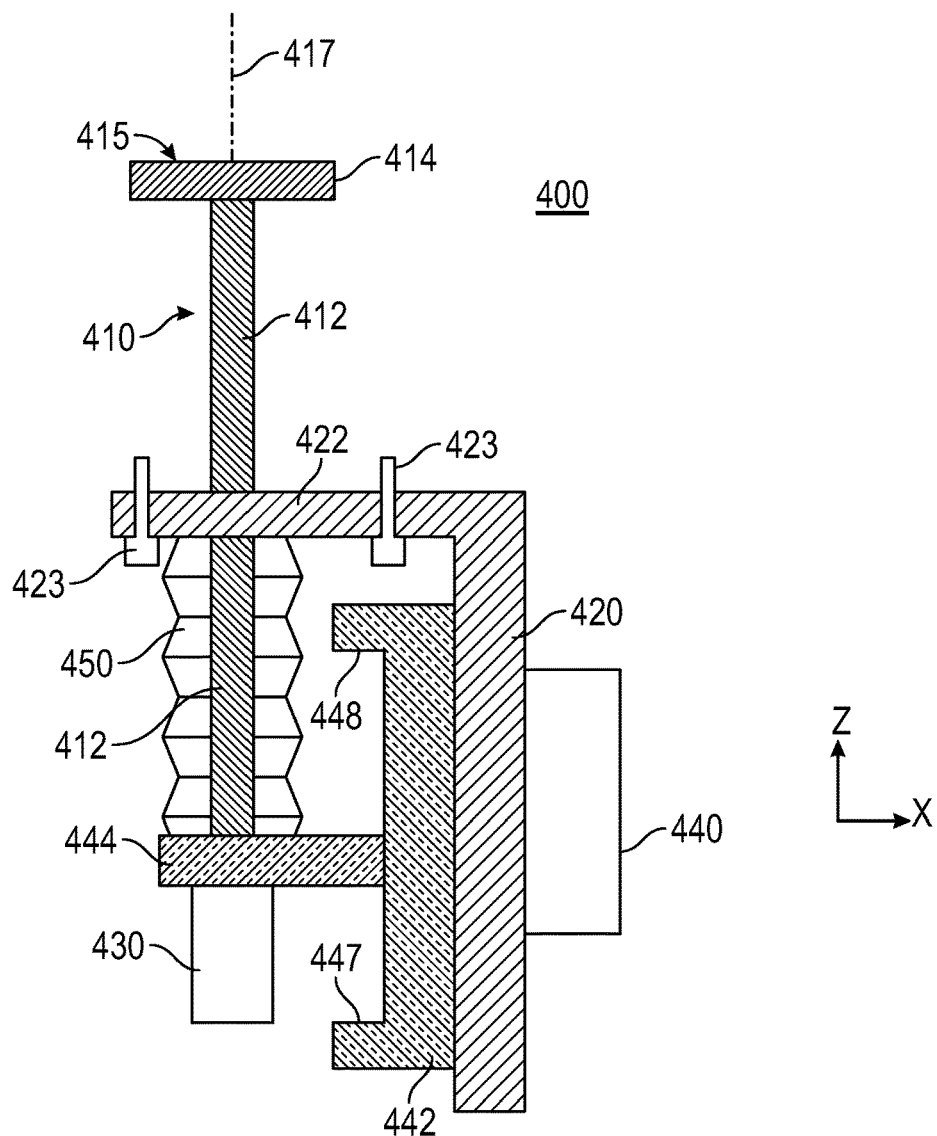
FIG. 8 illustrates a cross-sectional side view of a wafer rotation assembly in accordance with one or more embodiment of the disclosure.

FIGS. 7 and 8 illustrate some embodiments of the wafer rotation assembly 400. The exemplary embodiments illustrated should not be taken as limiting the scope of the disclosure as other arrangements will be understood by the skilled artisan. The wafer rotation assembly 400 includes a support fixture assembly 410. The support fixture assembly 410 comprises a support fixture 414 connected to a shaft 412. The support fixture 414 has a support surface 415 and is sized to pass through the opening 360 in the robot blade 218. The support fixture assembly 410 is movable in a direction orthogonal to the support surface 415 so that the support surface 415 can be moved through the opening 360.

The wafer rotation assembly 400 of some embodiments includes a support housing 420 with a flange 422. The flange 422 can be used to connect the support housing 420 to the underside of the robot adapter plate 317 or the bottom 315 of the housing 313. The support housing 420 can be connected by any suitable connection method including substantially permanent connections (e.g., welds) or removable connections (e.g., bolts). In the embodiment illustrated, two bolts 423 are shown passing through the flange 422. When connected to the robot adapter plate 317 or the bottom 315, the support housing 420 helps seal the opening 395 in the robot adapter plate 317 so that a vacuum can be maintained within the housing 313. One or more o-rings (not shown) can be positioned between the support housing 420 and the robot adapter plate 317 or bottom 315 of the housing 313 to help form a gas-tight seal.

The support fixture 414 has a support surface 415 that is sized to support a wafer for rotation. The size of the support surface 415 can vary depending on, for example, the size of the wafer being processed; larger wafers may use a larger support surface area than a smaller wafer.

In some embodiments, the support surface 415 provides one contact point over a fixed area of the wafer. For example, the embodiment illustrated in FIG. 8 has a round support fixture 414 with a substantially flat support surface 415. As used in this manner, the term "substantially flat" means that when a wafer is resting on the support surface, greater than or equal to about 90%, 95%, 98% or 99% of the surface area of the support surface 415 is in contact with the wafer.

Figure 8A:
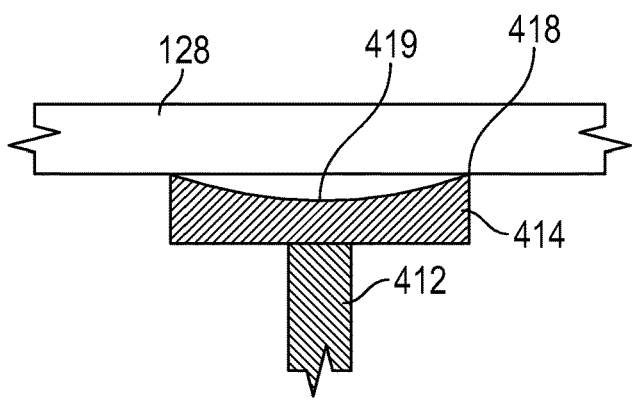
FIG. 8A shows an expanded view of a wafer support fixture for use with a wafer rotation assembly in accordance with one or more embodiment of the disclosure.

In some embodiments, the support surface 415 has a concave shape (as shown in FIG. 8A). A concave shaped support surface 415 will contact the wafer 128 at the peripheral edge 418 of the support fixture 414, with the center region 419 of the support surface 415 not contacting the wafer 128. The concave shape may provide sufficient support of the wafer while minimizing the contact area and potential damage to the wafer.

In some embodiments, as illustrated in FIG. 7, the support fixture 414 has a plurality of support posts 416 configured to contact a wafer. Using a support fixture 414 with multiple support posts 416 can support the wafer over a larger area while minimizing contact with wafer. The support posts 416 are configured to contact a wafer substantially simultaneously. As used in this manner, the term "substantially simultaneously" means that the height of the support posts 416 are within ±0.5 mm, ±0.4 mm, ±0.3 mm, ±0.2 mm, ±0.1 mm, or ±0.05 mm of average height of the support posts.

The support surface 415 of the support fixture 414 is adapted to provide sufficient friction to allow rotation of a wafer without causing damage or slippage of the wafer on the support fixture. In some embodiments, rotation of the support fixture 414 causes the wafer to rotate by the same amount within ±0.5°. The support surface 415 can be a layer on top of the support fixture 414 or can be the entire support fixture 414. In embodiments in which there are multiple support posts 416 (like FIG. 7), the top of the support posts 416 which provide the support surface 415 can be a different material than the support posts 416. The support surface 415 of some embodiments comprises a material that can handle wafers at temperatures up to about 600° C. In some embodiments, the support surface 415 comprises a material that can handle wafers at temperatures greater than 300° C., 400° C., 500° C. or 600° C.

A first actuator 430 is connected to the support fixture assembly 410 to rotate the support fixture assembly around a central axis 417 of the shaft 412. The axis 417 extends through the length of the shaft and is substantially orthogonal to the support surface 415 of the support fixture 414. The first actuator 430 can be any suitable actuator or motor that can cause rotation of the shaft around the axis and can be connected to the support fixture assembly 410 in any manner known to the skilled artisan. Examples of suitable actuators include, but are not limited to, stepper motors, servo motors and pneumatic cylinders. In some embodiments, the first actuator 430 is configured to rotate the support fixture assembly 410 in increments of 5°, 10°, 22.5°, 45°, 67.5°, 90°, 120°, 150°, 180° or greater.

A second actuator 440 can move the support fixture assembly 410 along the axis 417 of the shaft 412. In the embodiment illustrated in FIG. 8, movement along the axis 417 would be movement along the z-axis of the drawing. The second actuator 440 may also be referred to as a z-axis actuator or lift motor. The second actuator 440 in FIGS. 7 and 8 are connected to the support fixture assembly 410 through a linear actuator 442 connected to a shaft support 444. The shaft support 444 can be moved along the linear actuator 442 using any suitable movement components. In the embodiment illustrated in FIG. 7, a screw shaft 445 is turned by the second actuator 440. The screw shaft 445 contacts the shaft support 444 so that movement of the screw shaft 445 causes the shaft support 444 to move along the axis 417 of the shaft.

A hard stop 447 can stop the movement of the shaft support 444. In the embodiment of FIG. 7, the hard stop 447 is a component connected to the linear actuator 442 or the support housing 420. The shaft support 444 or the first actuator 430 can contact the hard stop 447 to prevent further movement of the support fixture assembly 410. In the embodiment of FIG. 8, the shaft support 444 can contact a hard stop 447 or hard stop 448 to prevent further movement along the z-axis in either direction along the axis.

The total amount of movement along the z-axis is referred to as the stroke distance. In FIG. 8, the stroke distance is the distance between hard stop 447 and hard stop 448 less the thickness of the shaft support 444. In some embodiments, the stroke distance is greater than or equal to about 0.5 inches (about 12 mm), about 1 inch (about 25 mm), about 2 inches (about 50 mm), about 3 inches (about 75 mm), about 4 inches (about 100 mm), about 5 inches (about 125 mm) or about 6 inches (about 150 mm). In some embodiments, the stroke distance is in the range of about 0.5 inches to about 6 inches.

To maintain a gas-tight seal, the shaft 412 may be enclosed in a sealed environment. The illustrated embodiments have a bellows 450 between the shaft support 444 and the flange 422. Expansion and contraction of the bellows 450 occurs with movement of the shaft support 444 while maintaining a gas-tight environment.

Figure 9:
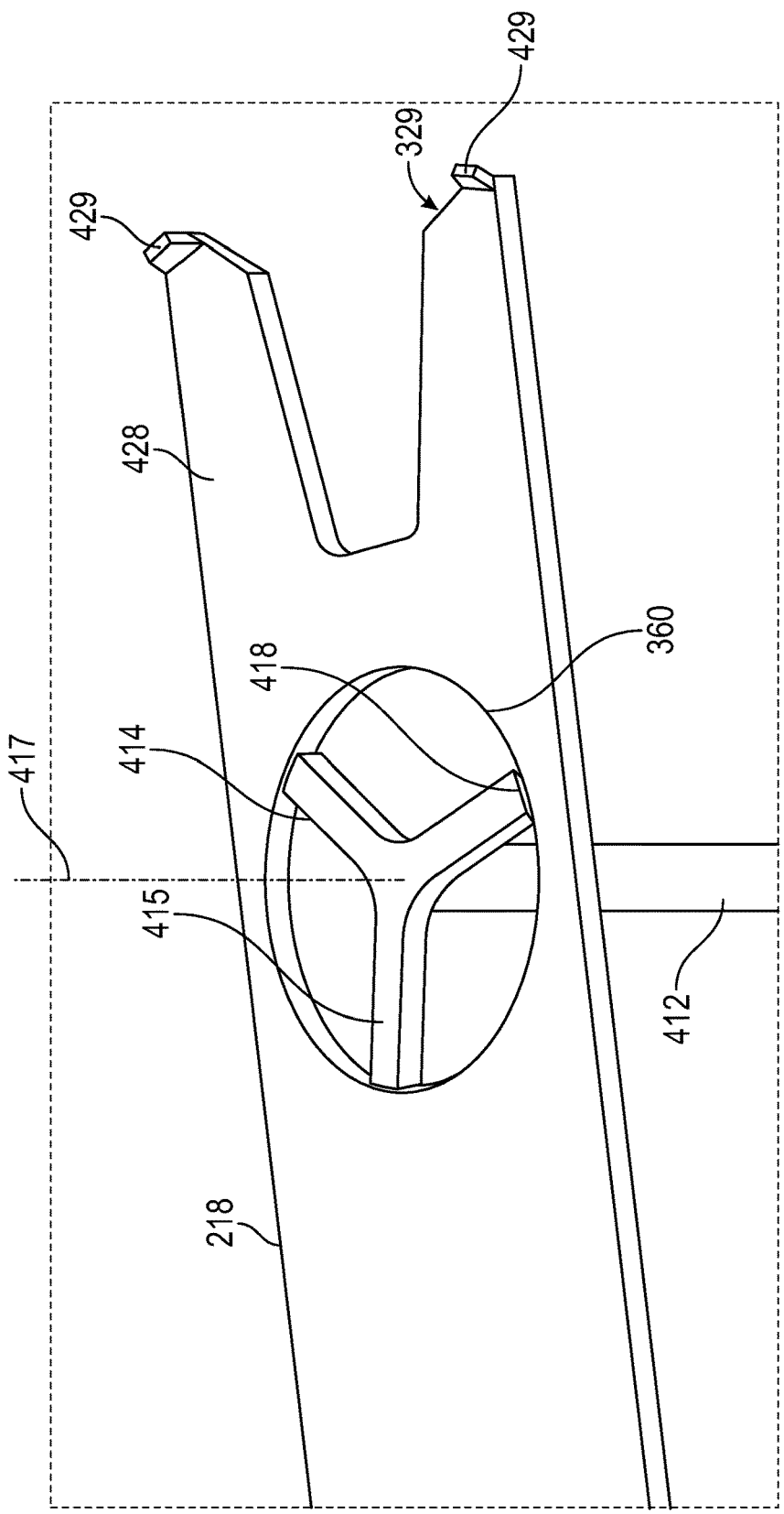
FIG. 9 illustrates a partial isometric view of a robot blade with opening and support fixture in accordance with one or more embodiment of the disclosure.

FIG. 9 shows a partial view of a robot blade 218 with the support fixture 414 and shaft 412. The robot blade 218 illustrated has fingers 429 at the distal end 329. The fingers 429 extend in a direction that is not co-planar with the top surface 428 of the robot blade 218. The fingers 429 extend at an angle in the direction of the top surface 428 of the robot blade 218 so that the fingers 429 are an impediment to distal movement of a wafer positioned on the top surface 428 of the robot blade 218. In the embodiment illustrated, a wafer being moved by the robot blade 218 will rest on the top surface 428. An edge of the wafer will be supported by the finger 429 to prevent the wafer from sliding distally on robot blade 218 during movement.

The support fixture 414 illustrated has a diameter that is smaller than the opening 360 in the robot blade 218. This allows the support fixture 414 to move through the opening 360 so that the support surface 415 can contact a wafer positioned on the top surface 428 of the robot blade. In some embodiments, the support fixture 414 has a diameter smaller than the opening 360 by an amount greater than or equal to about 0.05 mm, 0.1 mm, 0.15 mm, 0.2 mm or 0.25 mm. In some embodiments, the support fixture 414 has a diameter smaller than the opening 360 by an amount less than or equal to about 10 mm, 8 mm, 6 mm, 4 mm or 2 mm. In some embodiments, the opening 360 has a diameter larger than the diameter of the support fixture 414 by an amount in the range of about 0.05 mm to about 10 mm, or in the range of about 0.1 mm to about 8 mm, or in the range of about 0.15 mm to about 4 mm, or in the range of about 0.2 mm to about 2 mm. As used in this manner, the diameter of the support fixture 414 is greatest distance of a point on the peripheral edge 418 from the axis 417 of the shaft 412.

While a round opening 360 is illustrated in the Figures, those skilled in the art will recognize that the shape of the opening 360 can be any suitable shape and that the shape of the support fixture 414 can be any suitable shape that can fit through the opening 360 in the robot blade 218. In some embodiments, the opening 360 is one or more of an oval, triangle, square, pentagon, hexagon, heptagon, octagon, nonagon or decagon. In some embodiments, the shape of the support fixture 414 is complementary to the shape of the opening 360. For example, the support fixture 414 illustrated in FIG. 7 can be complementary to a round or triangular shaped opening 360.

Some embodiments of the disclosure provide process kits for fitting a transfer chamber or other chamber with a wafer rotation assembly 400 and a complementary robot blade. In some embodiments, the process kit includes at least one wafer rotation assembly 400, a robot adapter plate 317 and at least one robot blade 218. The bottom of a transfer chamber can be removed and replaced with a robot adapter plate 317. The wafer rotation assemblies 400 can be connected to the robot adapter plate 317 so that the support fixture assembly protrudes through the opening 395 in the robot adapter plate 317. An existing robot in the transfer chamber can be refit to replace the existing robot blade with a new robot blade 218 including opening 260. The robot blade 218 configured to be connected to a robot blade hub at a proximal end 328 of the robot blade 218. The process kit of some embodiments includes one or more of the disclosed embodiments of the wafer rotation assembly 400, one or more of the disclosed embodiments of the robot blade 218 and one or more of the disclosed embodiments of the robot adapter plate 317. In some embodiments, the kit includes one or more of the disclosed embodiments of the wafer rotation assembly 400 and one or more of the disclosed robot blades 218. The kit can include a robot adapter plate 317 or can be used with a transfer chamber that has openings 395 in the bottom sufficient to allow the wafer rotation assembly 400 to operate.

Referring to FIGS. 10A through 10H, one or more embodiments of the disclosure are directed to methods of processing a wafer 128. The methods are illustrated as cross-sectional views of a portion of a transfer chamber 312. The portion illustrated includes the opening 395 in the bottom 315 of the transfer chamber 312 and the opening 316 (e.g., a slit valve) in the sidewall of the transfer chamber 312. The wafer rotation assembly 400 is outside the view of the Figures with only the support fixture assembly 410 (shaft 412 and support fixture 414) being illustrated.

Figure 10A:
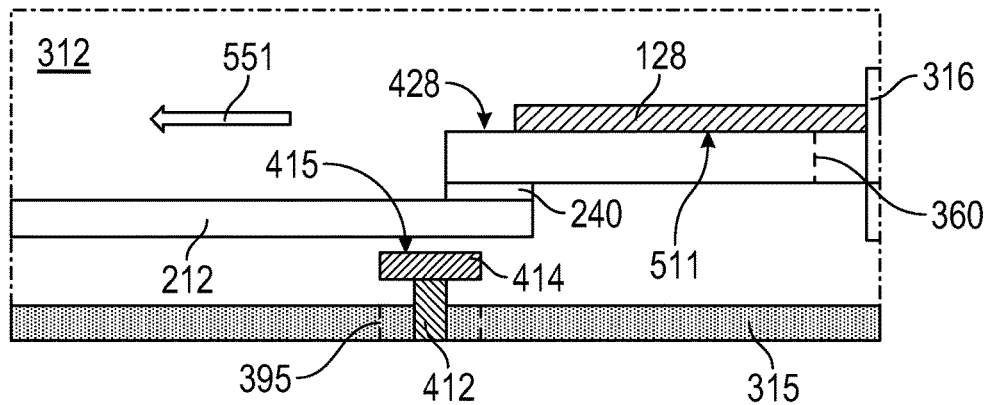
FIGS. 10A through 10H illustrate a method of processing a wafer using a wafer rotation assembly in accordance with one or more embodiment of the disclosure.

In FIG. 10A, a robot blade 218 with an opening 360 is moved through the opening 316 in the sidewall of the transfer chamber 312. Movement of the robot blade 218 can involve movement of robot blade hub 240 and extension arm 212. The support fixture 414 connected to the shaft 412 is in a lowered position so that the support surface 415 is exposed. Movement of the robot blade 218 occurs in direction 551 which is indicated as removing the wafer 128 from a processing chamber on the other side of the opening 360. Prior to movement in direction 551, as will be understood by the skilled artisan, the robot blade 218 is moved in a direction opposite 551 into the adjacent processing chamber where a wafer 128 is positioned on the robot blade 218 so that when the robot blade 218 is moved in direction 551, the wafer 128 is supported by the robot blade 218.

Figure 10B:
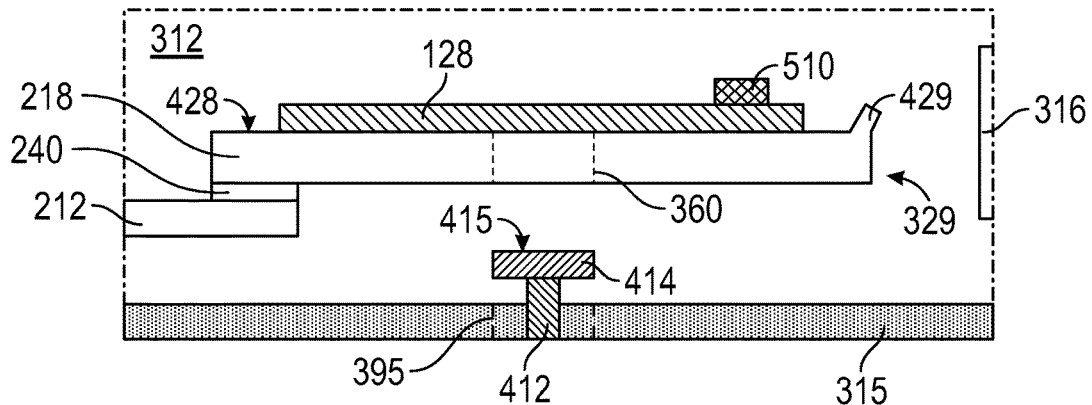

Once movement in direction 551 is complete, the components are in a position as illustrated in FIG. 10B. Here, the shaft 412 and support fixture 414 are aligned with opening 360 in the robot blade 218. A reference layer 510 is shown on the wafer 128 for visual and descriptive purposes and should not be taken as limiting the scope of the disclosure.

Figure 10C:
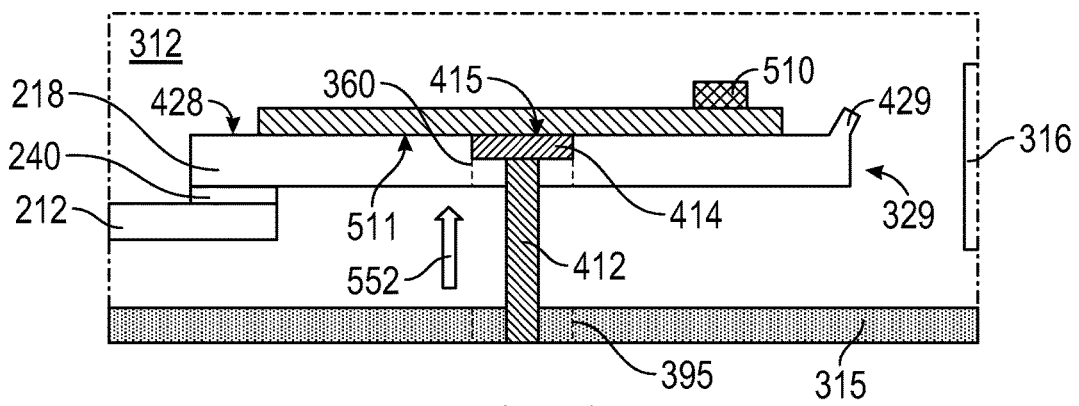

In FIG. 10C, the shaft 412 and support fixture 414 are moved in direction 552 so that the support surface 415 of the support fixture 414 contacts the bottom surface 511 of the wafer 128. Movement in direction 552 occurs at a first velocity so that the support fixture 414 can be moved faster when not in contact with a wafer 128 than when in contact with a wafer 128. The first velocity can be a constant velocity or can be variable so that the movement slows down as the support surface 415 approaches the wafer 128.

Figure 10D:
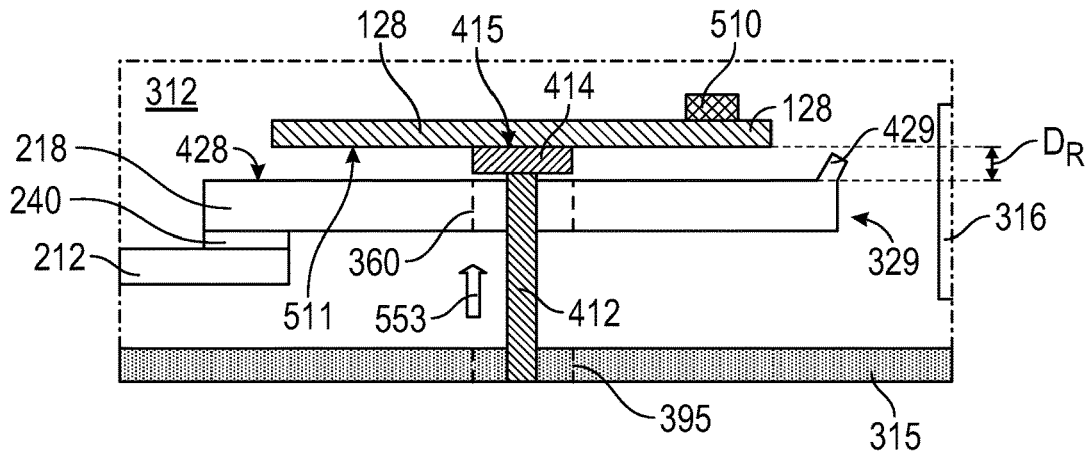

In FIG. 10D, after the support surface 415 contacts the bottom surface 511 of the wafer 128, the support fixture 414 is moved in direction 553 to move the wafer 128 off of the top surface 428 of the robot blade 218. The velocity of direction 553 (second velocity) can be the same as the first velocity of direction 552. In some embodiments, the velocity of direction 553 is slower than the velocity of direction 552. The first velocity and the second velocity can be seamlessly the same so that there is no change in overall velocity between FIGS. 10C and 10D.

The movement in direction 553 causes the bottom surface 511 of the wafer 128 to be separated from the top surface 428 of the robot blade 218 by a distance $D_R$. The distance $D_R$ of some embodiments is in the range of about 0.1 mm to about 50 mm, or in the range of about 0.5 mm to about 25 mm, or in the range of about 1 mm to about 20 mm. In some embodiments, the distance $D_R$ is sufficient to ensure that the wafer 128 does not contact the top surface 428 of the robot blade 218 during rotation of the wafer 128. This might occur if the elevated wafer and the top surface 428 of the robot blade 218 are out of parallel. When the top surface 428 of the robot blade 218 and the bottom surface 511 of the wafer 128 are out of parallel, a larger distance $D_R$ may allow rotation without damaging the wafer 128. In some embodiments, the wafer 128 and the robot blade 218 are out of parallel by an amount less than or equal to about 1°, 0.9°, 0.8°, 0.7°, 0.6°, 0.5°, 0.4°, 0.3°, 0.2° or 0.1° or 0.08°.

Figure 10E:
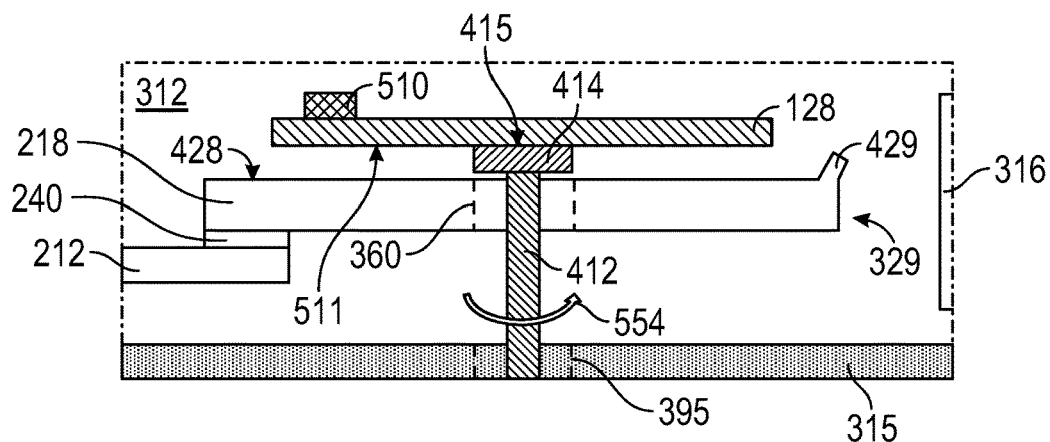

In FIG. 10E, after the wafer 128 has been elevated, movement of the support fixture 414 in direction 553 is stopped. The shaft 412 is rotated in direction 554 by a predetermined amount. Non-limiting examples of the rotation amount include 45°, 90°, 120° or 180°. In the embodiment illustrated, the shaft 412 is rotated in direction 554 by 180° so that the support fixture 414 and wafer 128 are rotated by the same amount. In the illustrated embodiment, reference layer 510 is moved from a side of the wafer 128 closest to the opening 316 to a side of the wafer furthest from the opening 316. Stated differently, rotation of the shaft 412 causes the orientation of the wafer 128 on the robot blade 218 to be altered by an amount approximately equal to the amount of rotation.

Figure 10F:
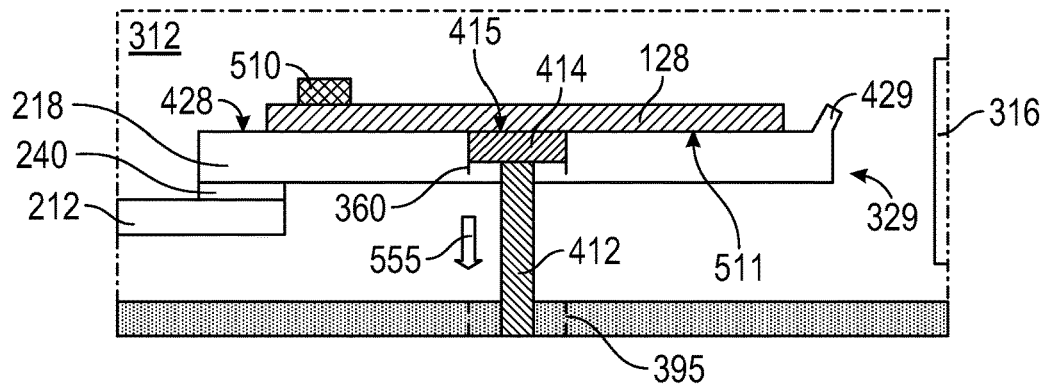

In FIG. 10F, the shaft 412 and support fixture 414 are moved in direction 555 at a third velocity to allow the bottom surface 511 of the wafer 128 to contact the top surface 428 of the robot blade 218 to that the wafer 128 comes to rest on the robot blade 218.

Figure 10G:
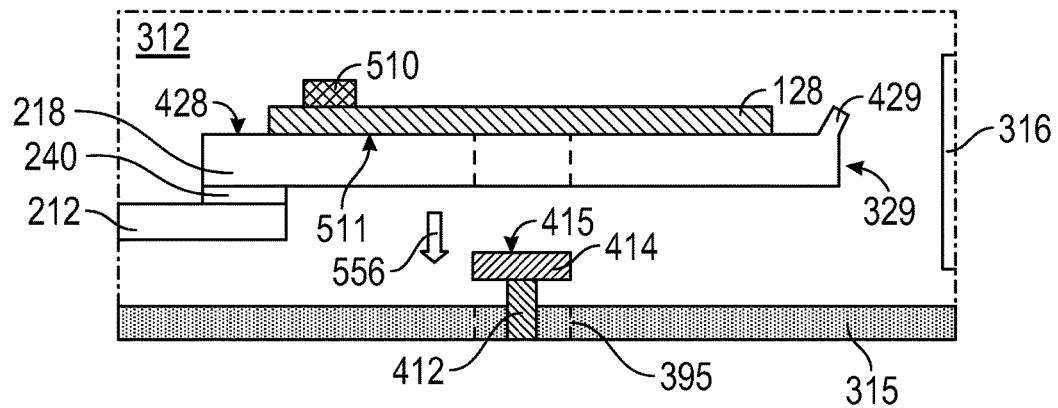

In FIG. 10G, the shaft 412 and support fixture 414 are moved in direction 556 at a fourth velocity to move the support surface 415 to a position below the robot blade 218. This allows the robot blade 218 to be moved without contacting or damaging the support fixture 414 or shaft 412. The distance that the support fixture 414 and shaft 412 are moved in direction 556 can vary depending on, for example, the robot components and the length of the shaft 412. The fourth velocity can be the same or different than the third velocity. In some embodiments, the fourth velocity is greater than the third velocity so that after the wafer 128 is positioned on the robot blade 218, the support fixture 414 can be moved less delicately than when supporting the wafer 128.

Figure 10H:
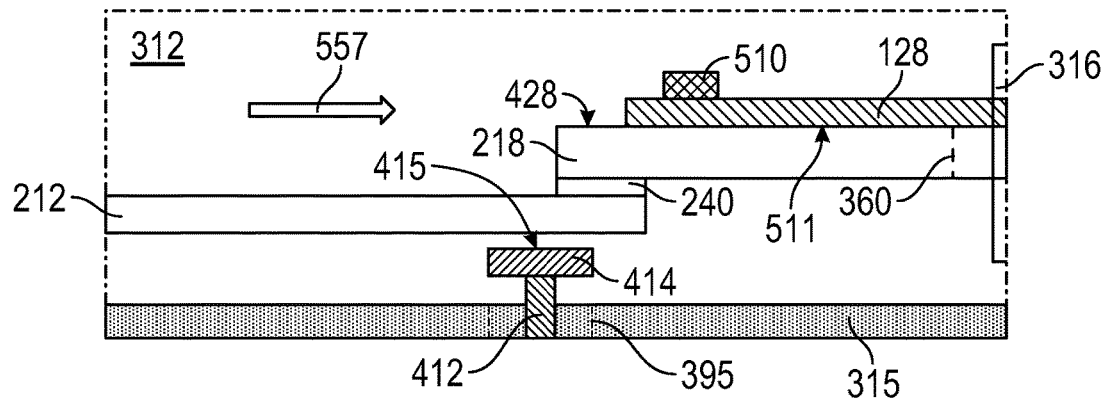

In FIG. 10H, the robot blade 218 is moved in direction 557 to return the wafer 128 to the adjacent processing chamber through opening 316. With a 180° turn on the support fixture 414, the wafer 128 is not in an opposite orientation in the processing chamber. The number of trips into and out of the processing chamber can vary depending on the process being employed. In some embodiments, the wafer is rotated a sufficient number of times between processing to complete an integer value of a full circle less one.

In some embodiments, the processing chamber, cluster tool or process kit includes a controller that can be connected to the wafer transport assembly and the wafer rotation assembly. The controller has one or more configurations selected from: a first configuration to move the robot blade into and/or out of a processing chamber connected to a side of the housing; a second configuration to align the opening in the robot blade with the support fixture of the wafer rotation assembly; a third configuration to operate the second actuator to raise the shaft and support fixture of the wafer rotation assembly so that the support fixture passes through the opening in the robot blade; a fourth configuration to operate the first actuator to rotate the shaft and support fixture of the wafer rotation assembly by a fixed amount; and a fifth configuration to operate the second actuator to lower the shaft and support fixture of the wafer rotation assembly so that the support fixture is lowered through the opening in the robot blade. Each of the configurations can include instructions to control any specific hardware to accomplish the process. For example, when moving the robot blade, the controller can control one or more actuators connected to the robot and slit valve.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. An apparatus comprising:
   a housing having a bottom and sidewall, the sidewall including at least one opening extending through the sidewall, the bottom including a robot adapter plate to connect a wafer transport assembly;
   a wafer transport assembly including a robot hub, a main robot linkage coupled to the robot hub and a robot blade coupled to the main robot linkage, the robot blade having a length with a distal end and an opening through the robot blade, the opening centered a distance from the distal end of the robot blade by an amount equal to about a radius of a wafer to be transferred by the robot blade, the distance being within about 120 mm to about 180 mm from the distal end of the robot blade; and
   a wafer rotation assembly comprising
      a support fixture assembly comprising a support fixture connected to a shaft, the support fixture having a support surface and sized to pass through the opening in the robot blade,
      a first actuator to rotate the support fixture assembly about an axis of the shaft, and
      a second actuator to move the support fixture assembly along the axis of the shaft.

2. The apparatus of claim 1, wherein the wafer rotation assembly further comprises a support housing with a flange to connect the support housing to an underside of the robot adapter plate, the support housing sealing the opening in the robot adapter plate so that a vacuum can be maintained within the housing.

3. The apparatus of claim 1, further comprising a controller connected to the wafer transport assembly and the wafer rotation assembly, the controller having one or more configurations selected from:
   a first configuration to move the robot blade into and/or out of a processing chamber connected to a side of the housing;
   a second configuration to align the opening in the robot blade with the support fixture of the wafer rotation assembly;
   a third configuration to operate the second actuator to raise the shaft and support fixture of the wafer rotation assembly so that the support fixture passes through the opening in the robot blade;
   a fourth configuration to operate the first actuator to rotate the shaft and support fixture of the wafer rotation assembly by a fixed amount; and
   a fifth configuration to operate the second actuator to lower the shaft and support fixture of the wafer rotation assembly so that the support fixture is lowered through the opening in the robot blade.

4. The apparatus of claim 1, wherein the robot blade is coupled to the main robot linkage through an extension arm, the robot blade connected to the extension arm at a robot blade hub and the extension arm connected to the main robot linkage at an extension hub.

5. The apparatus of claim 4, wherein the wafer transport assembly further comprises a second robot blade coupled to the main robot linkage, the second robot blade having a second length and a distal end with an opening therethrough.

6. The apparatus of claim 1, wherein the bottom of the housing has at least one wafer rotation opening to allow the wafer rotation assembly to be positioned on a side of the bottom opposite the wafer transport assembly and allow the shaft and support fixture of the wafer rotation assembly to move through the opening.

7. The apparatus of claim 1, wherein the bottom of the housing has a wafer rotation opening adjacent each opening in the sidewall.

8. The apparatus of claim 1, wherein the support fixture comprises a material that can handle a wafer at a temperature up to 600° C.

9. The apparatus of claim 8, wherein the support fixture has a support surface comprising a dielectric material that can rotate the wafer without causing damage or slippage of the wafer on the support fixture.

10. The apparatus of claim 1, wherein the support fixture has a support surface that provides one contact point over a fixed area of a wafer.

11. The apparatus of claim 1, wherein the support fixture comprises multiple support posts configured to contact a wafer substantially simultaneously.

12. The apparatus of claim 1, wherein the second actuator is configured to move the shaft and support fixture by a stroke distance in the range of about 0.5 inch to about 6 inches.

13. The apparatus of claim 1, wherein the support fixture is smaller than the opening in the robot blade.

14. A method comprising:
   moving a robot blade through a slit valve in a sidewall of a transfer station and into a processing chamber connected to the transfer station, the transfer station having a bottom and sidewall, the bottom including a robot adapter plate to connect a wafer transport assembly, the transfer station comprising a wafer transport assembly including a robot hub, a main robot linkage coupled to the robot hub and a robot blade coupled to the main robot linkage, the robot blade having a length with a distal end and an opening through the robot blade, the opening centered a distance from the distal end of the robot blade by an amount equal to about a radius of a wafer to be transferred by the robot blade, the distance being within about 120 mm to about 180 mm from the distal end of the robot blade; and
   moving the robot blade through the slit valve in the sidewall from the processing chamber into the transfer station, the robot blade supporting a wafer removed from the processing chamber;
   moving a support fixture of a wafer rotation assembly through an opening in the robot blade to move the wafer a distance from the robot blade, the wafer rotation assembly comprising a support fixture assembly comprising a support fixture connected to a shaft, the support fixture having a support surface and sized to pass through the opening in the robot blade, a first actuator to rotate the support fixture assembly about an axis of the shaft, and a second actuator to move the support fixture assembly along the axis of the shaft;

rotating the support fixture and the wafer on the support fixture by a predetermined amount; and moving the support fixture of the wafer rotation assembly through the opening in the robot blade to move the wafer back onto the robot blade so that an orientation of the wafer on the robot blade has been changed.

\* \* \* \* \*